United States Patent
Staab

[11] Patent Number: 5,570,033
[45] Date of Patent: Oct. 29, 1996

[54] SPRING PROBE BGA (BALL GRID ARRAY) CONTACTOR WITH DEVICE STOP AND METHOD THEREFOR

[75] Inventor: Craig C. Staab, Mesa, Ariz.

[73] Assignee: VLSI Technology, Inc., San Jose, Calif.

[21] Appl. No.: 504,944

[22] Filed: Jul. 20, 1995

[51] Int. Cl.⁶ ............................. H01R 13/62; G01R 1/04
[52] U.S. Cl. ........................... 324/761; 439/71; 324/754; 324/758
[58] Field of Search ..................... 324/754, 765, 324/758; 439/71, 266

[56] References Cited

U.S. PATENT DOCUMENTS

| | | | |
|---|---|---|---|
| 5,376,010 | 12/1994 | Petersen | 439/71 |
| 5,400,220 | 5/1994 | Swamy | 361/760 |
| 5,418,471 | 5/1995 | Kardos | 324/758 |
| 5,419,710 | 5/1995 | Pfaff | 439/266 |

*Primary Examiner*—Kenneth A. Wieder
*Assistant Examiner*—Barry C. Bowser
*Attorney, Agent, or Firm*—Harry M. Weiss

[57] ABSTRACT

The present invention relates to a spring probe contactor for testing BGA devices. The spring probe contactor is comprised of a plurality of spring probes for providing a connection between a BGA device to be tested and a DUT board. The plurality of spring probes are held within a contactor block having a plurality of apertures therethrough. The apertures are wide enough to hold a single spring probe within the contactor block without the spring probe coming into contact with the contactor block. A retaining plate is coupled to the contactor block for holding the plurality of spring probes within the contactor block. The retaining plate has a raised portion thereon which limits the compression of the plurality of spring probes when a BGA device is placed in the spring probe contactor.

11 Claims, 1 Drawing Sheet

SPRING PROBE BGA (BALL GRID ARRAY) CONTACTOR WITH DEVICE STOP AND METHOD THEREFOR

BACKGROUND OF THE INVENTION

1. Field of the Invention

This invention relates generally to contactor systems for testing integrated circuits and, more specifically, to a contactor system for testing BGA (Ball Grid Array) devices and method therefor that limits the compression of spring probes within the BGA contactor system.

2. Description of the Prior Art

In order to test a BGA device, the contactor elements of the BGA device are inserted into a contactor plate having a plurality of sockets. The contactor plate is coupled to a DUT (Device Under Test) board which is coupled to a testing machine. The DUT board is, essentially, a printed circuit board that completes an electrical circuit between the BGA contactor elements via the contactor plate and the testing machine. In order to test the BGA device, the testing machine sends signals to and receives signals from the BGA device via the electrical conductor paths provided by the contactor plate and the DUT board.

The contactor plate usually contains a plurality of spring probes, i.e. pogo pins. When the contact elements on the BGA device are inserted into the contactor block, the spring probes are compressed. This provides an electrical connection between the contact elements on the BGA device and the contact points on the DUT board.

The problem with current BGA contactor plates is that these plates do not prevent over-driving of the BGA device that is being inserted into the BGA contactor plate. The over-driving of the BGA device results in the over-compression of the spring probes within the BGA contactor plate. This results in a loss of flexibility in the spring probes which causes a loss of electrical continuity between the BGA device being tested and the DUT board. While it is possible to replace the damaged spring probes, it is a time consuming and expensive process.

Therefore, there existed a need to provide an improved BGA contactor plate. The improved BGA contactor plate must prevent the over-driving of BGA devices into the BGA contactor plate. This will prevent the over-compression of the spring probes within the BGA contactor plate, thereby limiting the amount of damage to the spring probes.

SUMMARY OF THE INVENTION

In accordance with one embodiment of the present invention, it is an object of this invention to provide an improved BGA contactor plate and method therefor.

It is another object of the present invention to provide an improved BGA contactor plate and method therefor which prevents over-driving of BGA devices into the BGA contactor plate, thus preventing over-compression of the spring probes within the BGA contactor plate.

BRIEF DESCRIPTION OF THE PREFERRED EMBODIMENTS

In accordance with one embodiment of the present invention, an improved spring probe contactor for testing BGA (Ball Grid Array) devices is disclosed. The improved spring probe contactor limits the compression of the spring probes within the spring probe contactor when a BGA device is placed in the spring probe contactor. The spring probe contactor is comprised of a plurality of spring probe means for providing a connection with a BGA device to be tested when the BGA device is placed in the spring probe contactor. A contactor block means is used for holding the plurality of spring probe means. The contactor block means has a plurality of apertures therethrough which are used for holding the plurality of spring probe means within the contactor block means. A retaining means is coupled to the contactor block means for holding the plurality of spring probe means within the contactor block means. The retaining means has a raised portion thereon which limits the compression of the plurality of spring probe means within the contactor block means when the BGA device is placed in the spring probe contactor.

In accordance with another embodiment of the present invention, a method of providing a spring probe contactor for testing BGA devices that limits compression of spring probes within the spring probe contactor when a BGA device is placed in the spring probe contactor is disclosed. The method is comprised of the steps of: providing a plurality of spring probe means for providing a connection with each BGA device to be tested when the BGA device is placed in the spring probe contactor; providing contactor block means having a plurality of apertures therethrough for holding the plurality of spring probe means within the contactor block means; and providing retaining means coupled to the contactor block for holding the plurality of spring probe means within the contactor block means, and having means for limiting compression of the plurality of spring probe means when the BGA device is placed in the spring probe contactor.

The foregoing and other objects, features, and advantages of the invention will be apparent from the following, more particular, description of the preferred embodiments of the invention, as illustrated in the accompanying drawing.

DETAILED DESCRIPTION OF THE PREFERRED EMBODIMENTS

Figure 1:
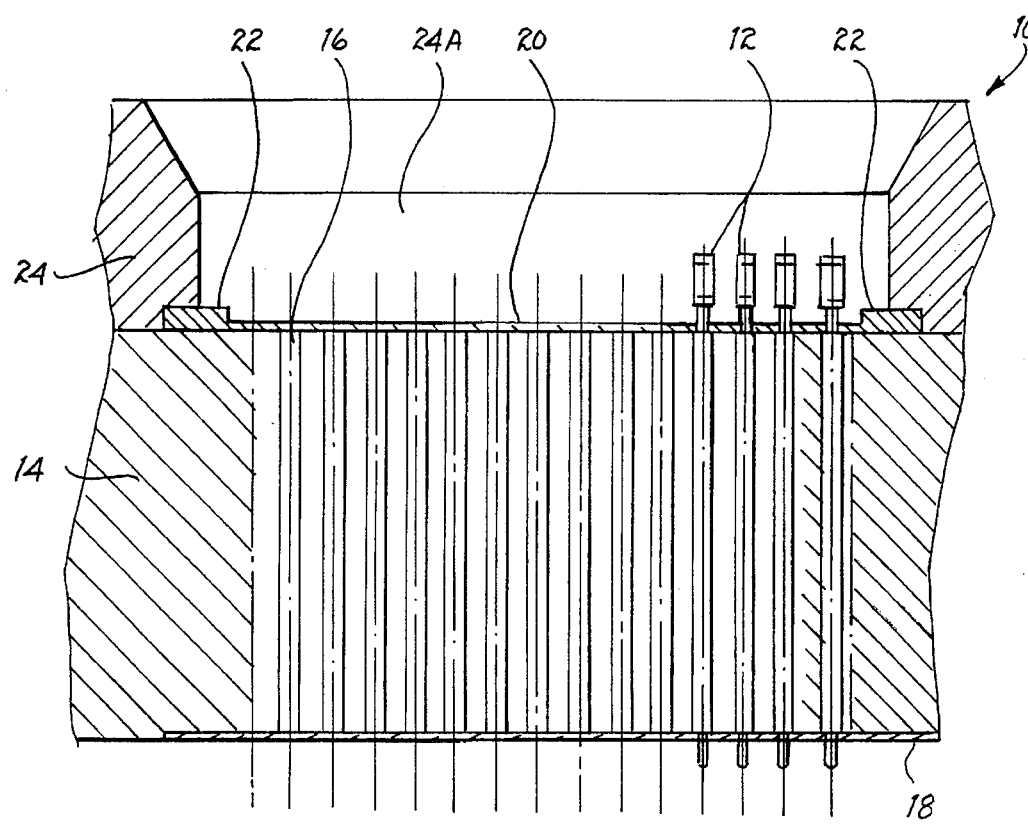
FIG. 1 is a cross-sectional side view of the BGA contactor with device stop of the present invention.
Figure 2:
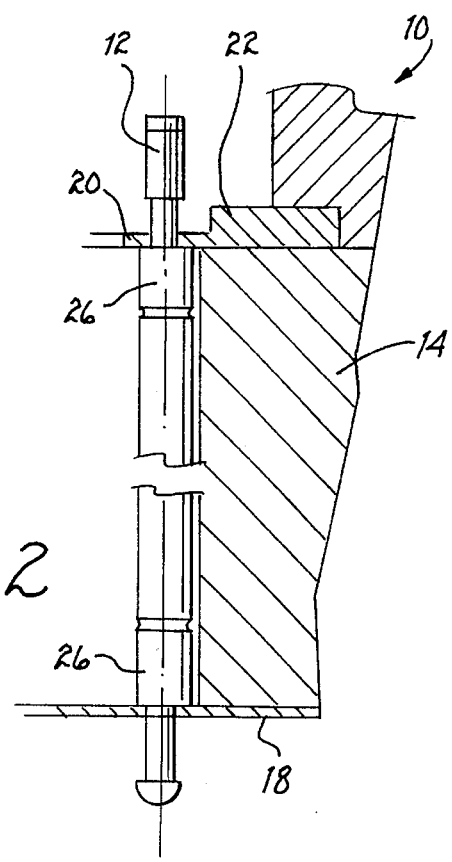
FIG. 2 is a sectional view of the device stop of the BGA contactor of FIG. 1.

Referring to FIGS. 1 and 2, a BGA contactor plate with device stop 10 (hereinafter contactor plate 10) is shown. The contactor plate 10 is comprised of a plurality of double ended spring probes 12 (hereinafter spring probes 12), i.e. pogo pins. The spring probes 12 are used for providing an electrical connection between a BGA device that is being tested and a DUT board (not shown). The spring probes 12 are held within a contactor block 14. The contactor block 14 has a plurality of apertures 16 drilled therethrough. The apertures 16 are drilled so as to hold the spring probes 12 within the contactor block 14. Isolation rings 26 are coupled to a top portion and a bottom portion of each of the plurality of spring probes 12. The isolation rings are used for ensuring that the plurality of spring probes 12 do not come in contact with the contactor block 14 when the plurality of spring probes 12 are positioned within the contactor block 14.

A bottom keeper plate 18 is coupled to a bottom portion of the contactor block 14. The bottom keeper plate 18 is used to hold the plurality of spring probes 12 within the contactor block 14. A top keeper plate 20 is coupled to a top portion of the contactor block 14 and is also used for holding the plurality of spring probes 12 within the contactor block 14. A guide plate 24 is coupled to the top keeper plate 20 and the contactor block 14. The guide plate 24 has a centrally located aperture 24A therethrough. The guide plate 24 helps in aligning and holding the BGA device in the contactor plate 10.

Along the edge of the top keeper plate 20 is a raised portion 22. The raised portion 22 is a BGA device stop which prevents over-insertion of a BGA device into the contactor plate 10. By limiting the amount of insertion of the BGA device, a user of the contactor plate 10 can limit the amount of compression of the spring probes 12. This will extend the life of both the spring probes 12 and the contactor plate 10. In the preferred embodiment of the present invention, the raised portion 22 is of a suitable height to limit the compression of the plurality of spring probes 12 to less than 75% of a fully compressed spring probe 12. The 75% figure was chosen in order to eliminate the occurrence of damage to the plurality of spring probes 12 while ensuring a sufficient electrical connection between the plurality of spring probes 12 and the BGA device in the contactor plate 10.

While the invention has been particularly shown and described with reference to preferred embodiments thereof, it will be understood by those skilled in the art that the foregoing and other changes in form and details may be made therein without departing from the spirit and scope of the invention.

I claim:

1. A spring probe contactor for testing BGA (Ball Grid Array) devices that limits compression of spring probes within said spring probe contactor when each one of said BGA devices is placed in said spring probe contactor comprising, in combination:

a plurality of spring probe means for providing a connection with each BGA device to be tested when said BGA device is placed in said spring probe contactor;

contactor block means having a plurality of apertures therethrough for holding said plurality of spring probe means within said contactor block means;

retaining plate means coupled to said contactor block for holding said plurality of spring probe means within said contactor block means, and having means for limiting compression of said plurality of spring probe means when said BGA device is placed in said spring probe contactor; and isolation ring means coupled to a top portion and a bottom portion of each of said plurality of spring probe means for ensuring said plurality of spring probe means do not come in contact with said contactor block means when said plurality of spring probe means are positioned within said contactor block means.

2. A spring probe contactor for testing BGA devices in accordance with claim 1 wherein said retaining plate means is comprised of top keeper plate means coupled to a top portion of said contactor block means for holding said plurality of spring probe means within said contactor block means, said top keeper plate means having a raised portion thereon for limiting insertion of a BGA device in said spring probe contactor thereby limiting compression of said plurality of spring probe means.

3. A spring probe contactor for testing BGA devices in accordance with claim 2 wherein said raised portion on said top keeper plate is of suitable thickness to limit compression of said plurality of spring probe means to less than 75% of a fully compressed condition in order to eliminate the occurrence of damage to said plurality of spring probe means while ensuring a sufficient electrical connection between said plurality of spring probe means and said BGA device in said spring probe contactor.

4. A spring probe contactor for testing BGA devices in accordance with claim 2 further comprising bottom keeper plate means coupled to a bottom portion of said contactor block means for holding said plurality of spring probe means within said contactor block means.

5. A spring probe contactor for testing BGA devices in accordance with claim 1 further comprising guide plate means coupled to said retaining plate means and having an aperture therethrough for aligning and holding said BGA device in said spring probe contactor.

6. A spring probe contactor for testing BGA devices that limits compression of spring probes within said spring probe contactor when a BGA device is placed in said spring probe contactor comprising, in combination:

a plurality of spring probe means for providing a connection with each BGA device to be tested when said BGA device is placed in said spring probe contactor;

contactor block means having a plurality of apertures therethrough for holding said plurality of spring probe means within said contactor block means;

top keeper plate means coupled to a top portion of said contactor block means for holding said plurality of spring probe means within said contactor block means, said top keeper plate means having a raised portion thereon for limiting insertion of a BGA device in said spring probe contactor thereby limiting compression of said plurality of spring probe means to less than 75% of a fully compressed condition in order to eliminate the occurrence of damage to said plurality of spring probe means while ensuring a sufficient electrical connection between said plurality of spring probe means and said BGA device in said spring probe contactor;

bottom keeper plate means coupled to a bottom portion of said contactor block means for holding said plurality of spring probe means within said contactor block means;

guide plate means coupled to said top keeper plate means and having an aperture therethrough for aligning and holding said BGA device in said spring probe contactor; and isolation ring means coupled to a top portion and a bottom portion of each of said plurality of spring probe means for ensuring said plurality of spring probe means do not come in contact with said contactor block means when said plurality of spring probe means are positioned within said contactor block means.

7. A method of providing a spring probe contactor for testing BGA devices that limits compression of spring probes within said spring probe contactor when each one of said BGA devices is placed in said spring probe contactor comprising the steps of:

providing a plurality of spring probe means for providing a connection with each BGA device to be tested when said BGA device is placed in said spring probe contactor;

providing contactor block means having a plurality of apertures therethrough for holding said plurality of spring probe means within said contactor block means;

providing retaining plate means coupled to said contactor block for holding said plurality of spring probe means within said contactor block means, and having means for limiting compression of said plurality of spring probe means when said BGA device is placed in said spring probe contactor; and providing insolation ring means coupled to a top portion and a bottom portion of each of said plurality of spring probe means for ensuring said plurality of spring probe means do not come in contact with said contactor block means when said plurality of spring probe means are positioned within said contactor block means.

8. The method of claim 7 wherein said step of providing retaining plate means further comprises the step of providing top keeper plate means coupled to a top portion of said contactor block means for holding said plurality of spring probe means within said contactor block means, said top keeper plate means having a raised portion thereon for limiting insertion of a BGA device in said spring probe contactor thereby limiting compression of said plurality of spring probe means.

9. The method of claim 8 wherein said step of providing a top keeper plate having a raised portion thereon further comprises the step of providing a raised portion on said top keeper plate means of suitable thickness to limit compression of said plurality of spring probe means to less than 75% of a fully compressed condition in order to eliminate the occurrence of damage to said plurality of spring probe means while ensuring a sufficient electrical connection between said plurality of spring probe means and said BGA device in said spring probe contactor.

10. The method of claim 8 wherein said step of providing retaining plate means further comprises the step of providing bottom keeper plate means coupled to a bottom portion of said contactor block means for holding said plurality of spring probe means within said contactor block means.

11. The method of claim 7 further comprising the step of providing guide plate means coupled to said retaining plate means and having an aperture therethrough for aligning and holding said BGA device in said spring probe contactor.

\* \* \* \* \*